(12) United States Patent
Kanetaka et al.

(10) Patent No.: US 7,820,917 B2
(45) Date of Patent: Oct. 26, 2010

(54) CIRCUIT BOARD

(75) Inventors: Yoshifumi Kanetaka, Tokyo (JP); Naomi Ishizuka, Tokyo (JP)

(73) Assignee: NEC Corporation (JP)

( * ) Notice: Subject to any disclaimer, the term of this patent is extended or adjusted under 35 U.S.C. 154(b) by 891 days.

(21) Appl. No.: 10/597,306

(22) PCT Filed: Jan. 6, 2005

(86) PCT No.: PCT/JP2005/000049

§ 371 (c)(1),
(2), (4) Date: Jul. 19, 2006

(87) PCT Pub. No.: WO2005/074338

PCT Pub. Date: Aug. 11, 2005

(65) Prior Publication Data

US 2008/0190657 A1    Aug. 14, 2008

(30) Foreign Application Priority Data

Jan. 29, 2004    (JP)    ............................. 2004-020824

(51) Int. Cl.
*H05K 1/16*    (2006.01)
(52) U.S. Cl. .................. 174/260; 29/837; 361/794
(58) Field of Classification Search ............... 174/260, 174/262–266; 29/837–839, 845; 361/794
See application file for complete search history.

(56) References Cited

U.S. PATENT DOCUMENTS

| | | | | |
|---|---|---|---|---|
| 2002/0074164 A1 | 6/2002 | Ishizuka et al. | ............. | 174/263 |
| 2004/0108130 A1* | 6/2004 | Suzuki et al. | ............... | 174/252 |
| 2004/0238211 A1 | 12/2004 | Momokawa et al. | ........ | 174/260 |
| 2008/0190657 A1 | 8/2008 | Kanetakae et al. | .......... | 174/263 |

FOREIGN PATENT DOCUMENTS

| | | |
|---|---|---|
| JP | 04-369893 | 12/1992 |
| JP | 7-131140 | 5/1995 |
| JP | 08-083966 | 3/1996 |
| JP | 10-145022 | 5/1998 |
| JP | 11-219762 | 8/1999 |
| JP | H11-219762 | 8/1999 |
| JP | 2000-68636 | 3/2000 |
| JP | 2001-332851 | 11/2001 |
| JP | 2002-252452 | 9/2002 |
| JP | 2002-374051 | 12/2002 |
| JP | 2005-74338 | 3/2005 |
| WO | WO 2005/074338 | 11/2005 |

OTHER PUBLICATIONS

Official Action received in Japanese counterpart Application Serial No. 2008-287346.
Canon, Inc., Japanese Utility Model Application No. 84086/82 (Laid Open No. 187174/83), Dec. 12, 1983.
Sanyo Electric Co., Ltd., Japanese Utility Model Application No. 192046/86 (Laid Open No. 97264/88), Jun. 23, 1988.
Mitsumi Electric Co., Ltd., Japanese Utility Model Application No. 91874/79 (Laid Open No. 12375/81), Feb. 2, 1981.

* cited by examiner

*Primary Examiner*—Jeremy C Norris
(74) *Attorney, Agent, or Firm*—Hayes Soloway P.C.

(57) ABSTRACT

A circuit board includes a plurality of through holes into which a plurality of leads of one electronic devices are inserted and soldered with lead free solder. Among these through holes, the volume of through hole into which the outermost end lead of leads of the electronic device is inserted, is set greater than the volume of through hole, into which the lead at the position nearest to the center of the electronic device is inserted.

9 Claims, 9 Drawing Sheets

CIRCUIT BOARD

TECHNICAL FIELD

The present invention relates to a circuit board, and in particular, relates to a circuit board that includes through holes and that is suitable for mounting an electronic insert mounting device having leads to be inserted into the through holes and soldered, by means of soldering with lead-free solder.

BACKGROUND ART

A lot of leadless electronic devices are surface-mounted on a circuit board. On the other hand, in regard to some electronic devices, such as a connector and a variable resistor, their leads are inserted and soldered into through holes as electronic insert mounting devices. In this description, the through hole means a hole such as a plated through hole, a wall surface of which is covered by conductive film.

FIG. 1A is a plan view showing a structure of a portion of the conventional circuit board where electronic insert mounting devices are mounted, and FIG. 1B is a cross-sectional view taken along line A-A in FIG. 1A.

The circuit board that is used to mount electronic devices is usually manufactured by undergoing the following steps. First, a prepreg in which resin such as epoxy resin and polyimide resin is impregnated into a glass fabric base material and the resin is partially-hardened, or a prepreg in which phenol resin is impregnated into a paper base material and the resin is partially-hardened, and a copper-clad laminate in which copper foil is affixed on the prepreg by the pressure and heat treatment, are prepared. Then, the copper foil that is affixed on the copper-clad laminate is patterned by the photo etching method or the like, and a predetermined number of wiring substrates having copper foil patterns to be internal layer wires 3 are fabricated. Successively, in order to improve adhesion to the prepreg, the roughing process (blackening process) is applied to the copper foil surface of the wiring substrate. After that, these wiring substrates are laminated through the prepreg so that the wiring circuits are the outermost layers and are integrated by applying pressure and heat, and then resin laminate 2 having internal layer wires 3 inside is manufactured.

Then, holes which will become through holes 4 are opened in resin laminate 2 by the drilling process. Successively, in order to improve the connection between internal wires 3 and through holes 4, resin at internal wires 3 is cleaned (desmeared). After that, the activation process, the electroless plating process, and the electrolytic plating process are performed to form through holes 4, in each of which a conductive film is formed on a wall surface of the hole. Then, after through holes 4 are protected by the hole plugging process or the tenting process, the outermost copper layer is patterned to form external wires 5. At this time, lands 6 are formed around the openings of through holes 4 in both surfaces of the board. Through holes 4, external wires 5, and lands 6 may be formed by the pattern plating method.

Finally, although not shown, solder resists are formed in areas except the solder portions in both surfaces of the board, and then the manufacturing process of multi-layer circuit board 1 is completed.

The above is the manufacturing process of multi-layer circuit board 1 having internal wires 3. Alternatively, a double-sided circuit board may be formed by using a double-sided copper-clad plate as a starting material and by similarly performing the through hole forming step and subsequent steps.

In FIGS. 1A and 1B, a dashed-dotted line indicated by symbol ◯ shows the centerline of a case of an electronic device at the time when the electronic device is mounted. In the example shown in FIGS. 1A and 1B, the electronic device has an elongated plane shape with leads arranged in a line, and centerline ◯ is the centerline in the longitudinal direction of the electronic device. In the conventional circuit board, all the shapes and sizes of through holes 4 are equal without making a distinction between center through hole 4a, into which a lead closest to the center of the case of the electronic device is inserted, and outermost end through hole 4b, into which a lead at the outermost end of the case of the electronic device is inserted.

In the process of soldering the electronic device on multi-layer circuit board 1, which is manufactured like this, generally, after the reflow process of mounting surface-mounted devices, such as chip devices and QFP, is performed, the flow process of mounting electronic insert mounting devices is performed.

As solder materials used to solder electronic devices, tin-lead solder, in particular, tin-lead eutectic solder which is close to an eutectic composition and which has the mass ratio of Sn and Pb, like Sn:PB=60 to 63%:40 to 37%, has been used for a long time. Since tin-lead eutectic solder is a material having high ductility, during the soldering process or the like, the tin-lead eutectic solder can absorb the stress generated by differences of thermal expansions and thermal shrinkages between multi-layer circuit board 1 and the case of the electronic device or the like, and the solder can reduce the stress applied to multi-layer circuit board 1 and the electronic devices.

However, in recent years, due to increasing awareness of environmental issues, environment pollution caused by lead becomes problematic, and a shift to lead-free solder is rapidly promoted. This lead-free solder mainly includes tin and additionally includes silver, copper, zinc, bismuth, indium, antimony, nickel, germanium, and so on, and has characteristics that it is stronger in metal tensile strength and creep strength and is smaller in ductibility than conventional eutectic solder [typically, Sn is 63% (mass ratio) and the rest is Pb]. Also, the melting temperature of lead-free solder is relatively high, 190 to 230° C., whereas that of tin-lead eutectic solder is 183° C. Therefore, when lead-free solder is used, the stress generated by difference in thermal expansions and thermal shrinkages between the multi-layer circuit board and the case of the electronic device during the soldering process or the like is increased and the stress reduction effect by solder is decreased, and therefore the stress applied to the circuit board is increased. For that reason, the occurrence rate of the phenomenon in which the circuit board is broken, in particular, at the through hole portion at the outermost end of the electronic device, is increased. In other words, although such a phenomenon may occur when conventional tin-lead eutectic solder is used, the occurrence of this phenomenon is increased after the shift to lead-free solder.

More specific explanations are given of such a phenomenon, in which the circuit board is broken, with reference to FIGS. 2, 3A to 3C. FIG. 2 is a cross-sectional view showing a state in which an electronic device is soldered on conventional multi-layer circuit board 1 shown in FIGS. 1A and 1B by using lead-free solder. Also, FIGS. 3A to 3C are enlarged cross-sectional views showing the portion of outermost end through hole 4b in FIG. 2. These cross-sectional views are drawings based on cross-sectional photographs when an electronic device having a polyamide case and provided with a connector having 8-pins arranged in one-line or leads is soldered with lead-free solder (Sn-3.0Ag-0.5Cu) on a circuit board, which has FR-4 as a base material.

As shown in FIG. 2, each of leads 8 extending from case 7 of the electronic device is inserted into each of through holes 4 and is electrically and mechanically connected to a conductive film on the internal wall surface of each of through holes 4 and each of lands 6 with solder fillet 9. At this time, a lead of leads 8, which is inserted into center through hole 4a, is soldered so that its center almost coincides with the center of center through hole 4a and it extends almost vertically relative to multi-layer circuit board 1. On the other hand, a lead of leads 8, which is inserted into outermost end through hole 4b, is soldered so that its tip is positioned away from the center of outermost end through hole 4b in a direction (outside direction) opposite to the side of centerline ○ of case 7 of the electronic device at the time when it is mounted, and the lead is tilted in a direction toward centerline ○ of case 7 of the electronic device with progression toward the foot side (upper side in the drawing) of the corresponding lead of leads 8.

The reason that the electronic device is mounted like this is that case 7 of the electronic device and multi-layer circuit board 1 are different in materials and thus are different in thermal expansion coefficients, in particular, in the example shown in the drawings, the thermal expansion coefficient of case 7 of the electronic device is larger than that of multi-layer circuit board 1. Before the soldering process is performed, in outermost end through hole 4b, the center thereof almost coincides with the center of the corresponding lead of leads 8. However, during the soldering process, case 7 of the electronic device is thermally expanded by a larger amount than multi-layer circuit board 1, and therefore the relative position of case 7 of the electronic device and multi-layer circuit board 1 is shifted. The father is the position from centerline ○ of case 7 of the electronic device, the larger is the shift. Therefore, the outermost end lead of leads 8 is soldered on the position that is considerably shifted in a direction opposite to a direction from the center of outermost end through hole 4b to the center of case 7 at the time when the electronic device is mounted. Then, after the soldering process, as the temperature lowers, case 7 of the electronic device is thermally shrunk by a larger amount than multi-layer circuit board 1, and thus case 7 pulls the outermost end lead of leads 8 toward the side of the center of case 7 so that the outermost end lead of leads 8 is tilted in the direction toward centerline ○ of case 7 with progression toward the upper side in the drawings.

As shown in FIG. 3A, the outermost end lead of leads 8 is soldered at the position that is shifted in the direction opposite to the direction from the center of outermost end through hole 4b toward the center of case 7 at the time when the electronic device is mounted, and therefore, the amount of the solder in an area (A-portion: shaded area in the drawing) in the direction opposite to the center direction of the case of the electronic device, between through holes 4 and leads 8, is reduced. Then, due to temperature drop after the soldering process, leads 8 are tilted to the center of case 7 with progression toward the upper side in the drawings. At this time, because the amount of the solder in A-portion is small as abovementioned and lead-free solder has lower stress reduction capacity than the tin-lead eutectic solder, the effect that the lead-free solder absorbs and releases the stress generated by tilting of leads 8 is extremely small. Therefore, great stress is applied to corner portion B and internal wall surface C in the portion in the direction opposite to the center of the case at the time when the electronic device is mounted. Accordingly, as shown in FIG. 3B, corner crack 11 is apt to occur at corner portion B of outermost end through hole 4b, and, as shown in FIG. 3C, through hole separation 12, in which the conductive film covered on the internal wall surface of outermost end through hole 4b peels, is apt to occur. In such a situation, faulty electrical continuity of the electronic device will occur.

DISCLOSURE OF INVENTION

The present invention is made by taking the above problems into consideration, and thus has as an object to provide a highly reliable circuit board that can reduce the occurrence of through hole cracks and through hole separations, even though an electronic insert mounting device is mounted with lead-free solder.

To achieve the above object, a circuit board of one aspect of the present invention has a plurality of through holes into which a plurality of leads of one electronic device are inserted and soldered. Then, among these through holes, the volume of a through hole, into which an outermost end lead of the leads of the electronic device is inserted, is larger than the volume of a through hole, into which a lead of the leads which is located at a position nearest to a center of the electronic device is inserted.

In particular, in the circuit board of one aspect of the present invention, the plane shape of each through hole is a circle, and a diameter of the through hole, into which the outermost end lead of the electronic device is inserted, is larger than the diameter of the through hole, into which the lead at the position nearest to the center of the electronic device is inserted.

Also, in a circuit board of another aspect of the present invention, the plane shape of the through hole, into which the lead at the position nearest to the center of the electronic device is inserted, is a circle, while the plane shape of the through hole, into which the outermost end lead of said electronic device is inserted, is an ellipse. The major axis direction of the ellipse is parallel with a line that connects the center of the corresponding through hole and the center position of the electronic device at the time when the electronic device is mounted. Then, the length of the major axis of the ellipse is longer than the diameter of the through hole, into which the lead at the position nearest to the center of the electronic device is inserted.

Also, in a circuit board of a further aspect of the present invention, the size of the through hole, into which the outermost end lead of the electronic device is inserted, the size being measured in a direction of a straight line connecting a position of the outermost end lead of the electronic device, which is mounted before being soldered, and a center position of the electronic device at the time when the electronic device is mounted, is larger than the size in any direction in a plane of the through hole into which the lead at the position nearest to the center of the electronic device is inserted.

Also, in a circuit board of a further aspect of the present invention, when a thermal expansion coefficient of the electronic device is larger than a thermal expansion coefficient of the circuit board, the center position of the through hole, into which the outermost end lead of the electronic device is inserted, is shifted in a direction away from the center position of the electronic device at the time when the electronic device is mounted, from a position of the outermost end lead of the electronic device, which is mounted before being soldered. On the other hand, when the thermal expansion coefficient of the electronic device is smaller than the thermal expansion coefficient of the circuit board, the center position of the through hole, into which the outermost end lead of the electronic device is inserted, is shifted in a direction approaching the center of the electronic device at the time when the electronic device is mounted, from a position of the outermost end lead of the electronic device, which is mounted before being soldered.

According to the above-mentioned circuit board of each aspect of the present invention, when the position of the outermost end lead is shifted due to the difference of the amount of thermal expansion between the case of the electronic device and the circuit board during the soldering process, in the outermost end through hole into which the outermost end lead of the electronic device is inserted, among through holes to be soldered, it is ensured that a sufficient amount of solder exists between the lead and the internal wall surface in the through hole at a position in the lead-shifting direction. Therefore, a sufficient amount of solder can absorb the stress applied to the lead in the course of cooling after the soldering process. Accordingly, the stress applied to the corner portion and the internal wall surface of the outermost end through hole can be reduced, the occurrence of corner cracks or through hole separations in the outermost end through hole can be reduced, and reliability for ensuring electric continuity in mounting an electronic device can be improved. According to the present invention, in particular, when soldering is performed by using lead-free solder, reliability for ensuring electric continuity can be significantly improved.

BEST MODE FOR CARRYING OUT THE INVENTION

First Embodiment

Figure 1A:
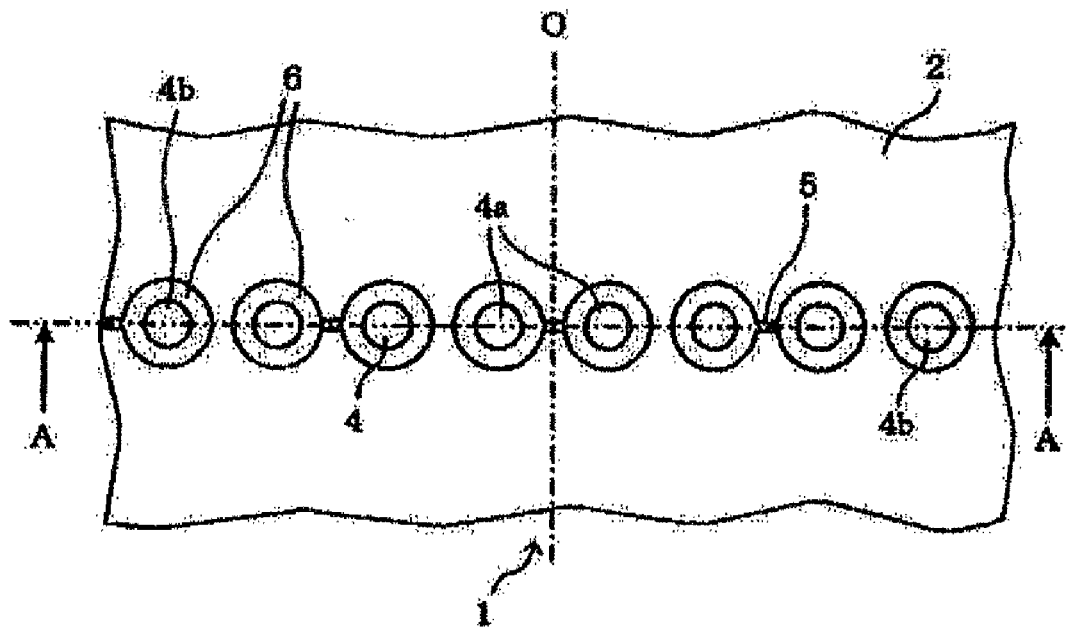
FIG. 1A is a plan view of an example of a conventional multi-layer circuit board.
Figure 1B:
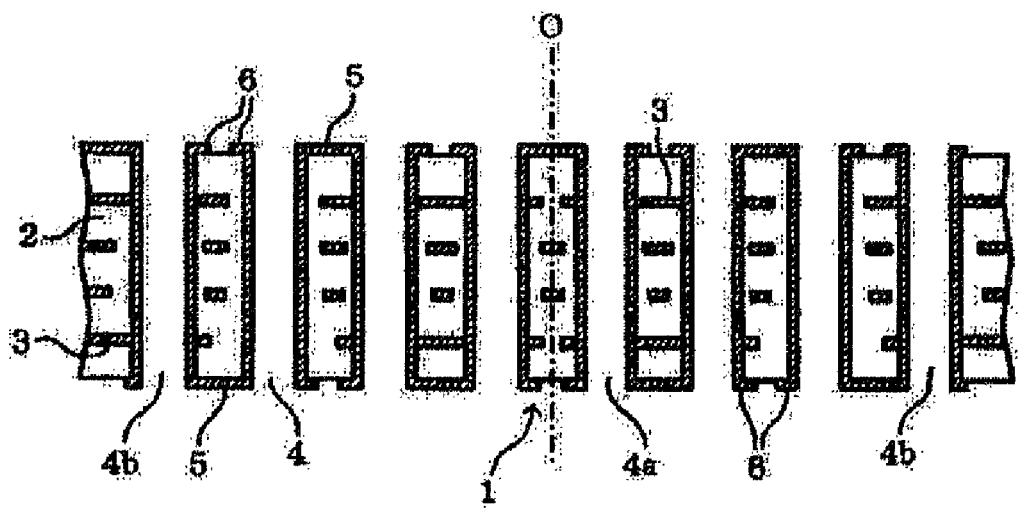
FIG. 1B is a cross-sectional view taken along line A-A in FIG. 1A.
Figure 2:
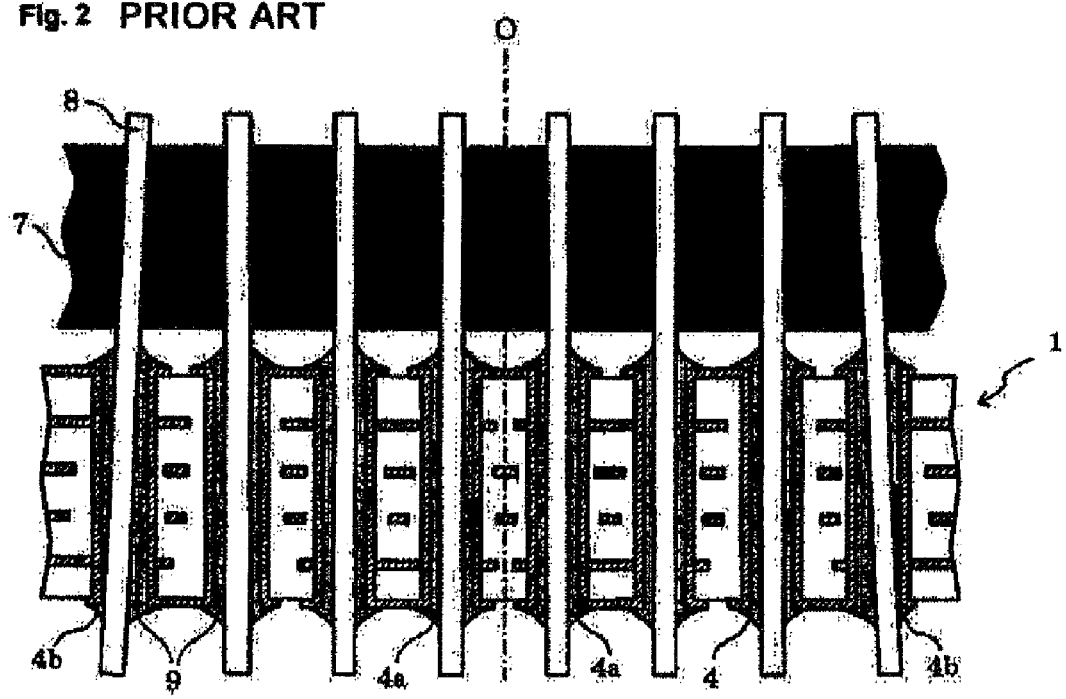
FIG. 2 is a cross-sectional view showing a state in which an electronic device is mounted on the multi-layer circuit board in FIG. 1A.
Figure 3A:
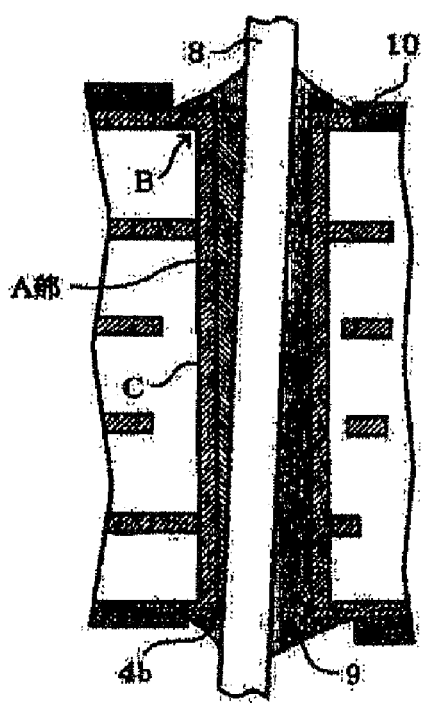
FIG. 3A is a cross-sectional view for explaining a problem in the multi-layer circuit board in FIG. 1A.
Figure 3B:
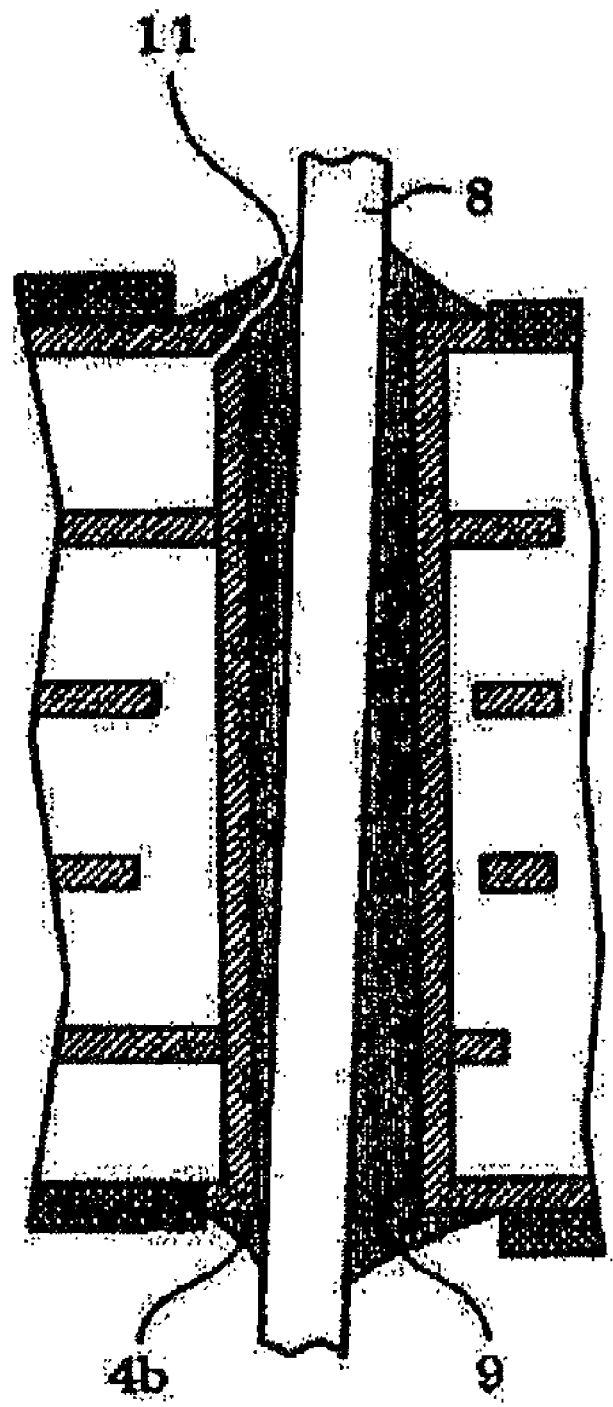
FIG. 3B is further cross-sectional view for explaining a problem in the multi-layer circuit board in FIG. 1A.
Figure 3C:
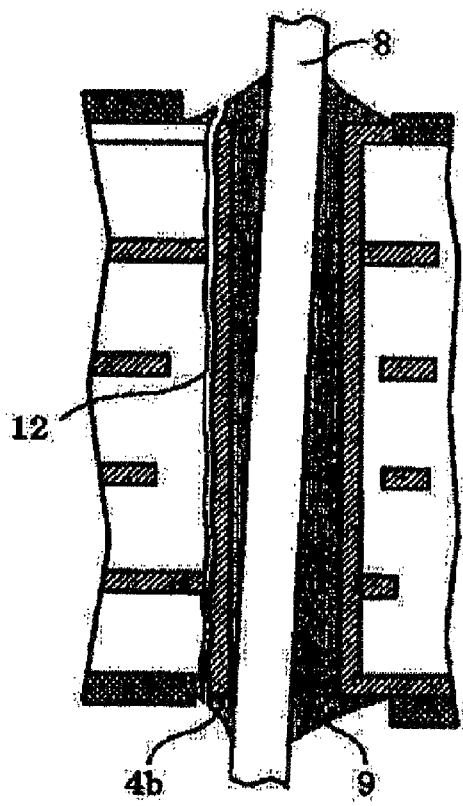
FIG. 3C is further cross-sectional view for explaining a problem in the multi-layer circuit board in FIG. 1A.
Figure 4A:
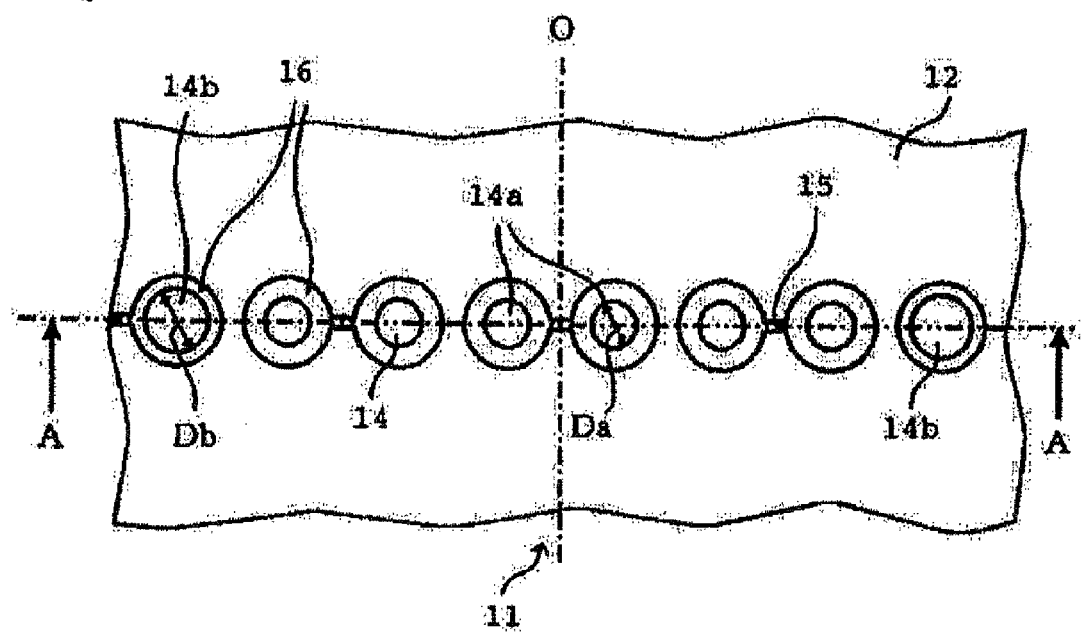
FIG. 4A is a plan view of a multi-layer circuit board according to a first embodiment of the present invention.
Figure 4B:
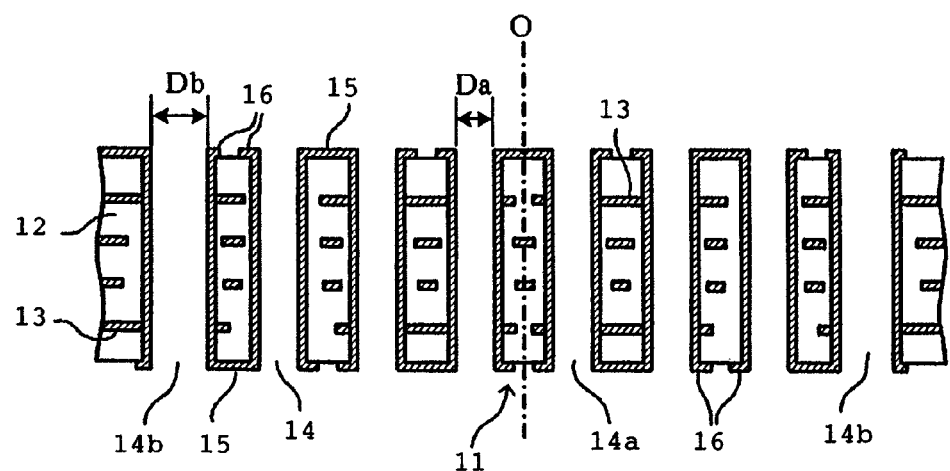
FIG. 4B is a cross-sectional view taken along line A-A in FIG. 4A.

FIG. 4A shows a plan view of multi-layer circuit board 11 according to the first embodiment of the present invention, viewed from the side of an electronic device mounting surface, and FIG. 4B shows a cross-sectional view taken along line A-A in FIG. 4A. Although many electronic surface mount devices and electronic insert mounting devices are mounted on multi-layer circuit board 11, FIG. 1 shows only a portion that are located at the mounting position of one electronic insert mounting device. Specifically, in the present embodiment, the electronic insert mounting device has a plurality of leads 18 arranged in a line (see FIG. 5). Likewise, the drawings for the other embodiments show only a portion that are located at the mounting position of one electronic insert mounting device.

As shown in FIGS. 4A and 4B, multi-layer circuit board 11 includes resin laminate 12 having internal wire 13 inside, as a base element. Through holes 14 are formed at the insertion positions of leads of the electronic insert mounting device. Lands 16 are formed at the edges of openings of through holes 14 on both sides of the board. External wires 15 are also formed on both sides of the board.

In FIGS. 4A and 4B, a dashed-dotted line indicates centerline ○ of case 17 of the electronic device in the alignment direction of leads 18 (see FIG. 5) at the time when the electronic device is mounted. In the present specification, among through holes 14, one that is at the position nearest to centerline ○ is described as center through hole 14a, and one that is at the farthest position is described as outermost end through hole 14b. In the present embodiment, diameter Db of outermost end through hole 14b is larger than diameter Da of other through holes 14 including center through hole 14a.

When the thermal expansion coefficient of the case of the electronic device is $\alpha$(ppm/° C.) and the thermal expansion coefficient of multi-layer circuit board 11 is $\beta$(ppm/° C.), the relationship of $\alpha > \beta$, is satisfied when the material of the case of the electronic device is plastic. In this case, diameter Db of outermost end through hole 14b is suitably set as:

$$Db = \{(\alpha-\beta) \times L\} \times 2 \times \Delta T + Da > Da$$

where the distance between the center of case 17 of the electronic device and the center of outermost end through hole 14b is indicated with L, and where the temperature difference of the case of the electronic device before and after the soldering process is indicated with $\Delta T$, namely, $\Delta T = \{$[maximum temperature (approximate 200° C.) of the case of the electronic device during the soldering process]−[room temperature (approximate 25° C.)]$\}$. In other words, according to this setting, even if the position of the outermost end lead of leads 18 of the electronic device is shifted by being heated during the soldering process, a certain distance can be kept between the corresponding lead of leads 18 and the wall surface at the side opposite to the center of case 17 of the electronic device and a sufficient amount of solder can be kept between this wall surface and the corresponding lead of leads 18.

Further, $Db/2 > P/2$ must be satisfied in accordance with a bearing on the space between outermost end through hole 14b and a through hole of through holes 14 which is adjacent thereto, in particular, in accordance with a bearing on pitch P due to the fact that intervals of respective through holes 14 are set constant in the example shown in the drawings.

Generally, pitch P between adjacent through holes 14 is often set to satisfy the relationship of P>2Da, and therefore diameter Db of outermost end through hole 14b is desirably set within the following range:

Da<Db<2Da

Further, when the diameter of the land for outmost through hole 14b is indicated with D and when D<2Da is satisfied, the following relationship is satisfied:

Da<Db<D.

Needless to say, consideration has to be given to board strength and so on, when the diameter of outermost end through hole 14b is determined.

Using multi-layer circuit board 1, which is structured like this, a flow process is performed to mount the electronic device. For example, the flow process is performed as follows: 1. mounting an electronic device on multi-layer circuit board 11 at a predetermined position; 2. applying flux to a side of multi-layer circuit board 11 where it will come into contact with the solder jet; 3. preheating; 4. immersing multi-layer circuit board 11 in a solder bath that sprays jets of melted lead-free solder; and 5. cooling.

The main process condition in the flow process is set so that lead-free solder can reach lands 16 at the side of a surface, on which the device is mounted, to form solder fillets, for example, as follows:

Preheating temperature: 100 to 120° C.
Conveyor speed: 0.8 to 1.2 m/min
Solder jet: double wave
Solder bath temperature: 250±5° C.

Figure 5:
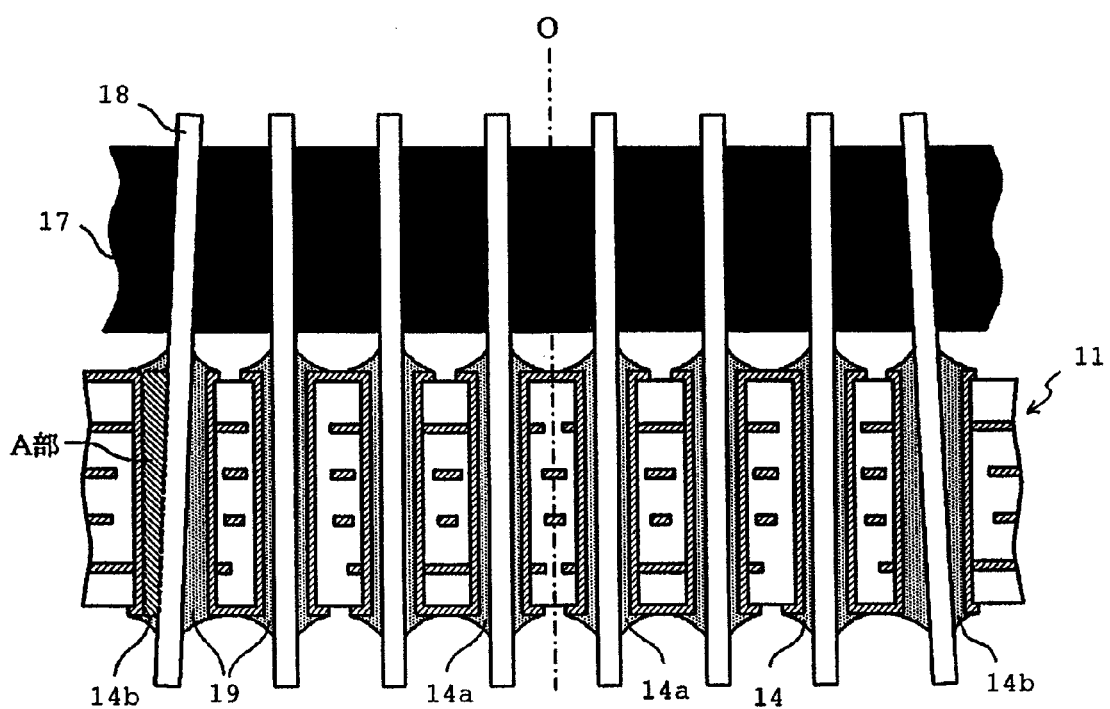
FIG. 5 is a cross-sectional view showing a state in which an electronic device is mounted on the multi-layer circuit board in FIG. 4A.

FIG. 5 is a cross-sectional view showing a state in which the electronic device is mounted on multi-layer circuit board 11 according to the first embodiment shown in FIG. 4. As shown in FIG. 5, the electronic device having case 17 and leads 18 is mounted on multi-layer circuit board 11, and solder fillets 19 are formed in through holes 14 and on lands 16. As described above, in the present embodiment, among through holes 14, diameter Db of outermost end through hole 14b, into which an outermost end lead of leads 18 or the electronic device is inserted, is larger than diameter Da of center through hole 14a, into which a lead of leads 18 which is located at the position nearest to the center of the electronic device is inserted (i.e., Db>Da). Therefore, the amount of the solder filled in outermost end through hole 14b is larger than the amount of the solder filled in center through hole 14a. In particular, in outermost end through hole 14b, a sufficient amount of the solder can be kept in the area at the side opposite to centerline O of case 17 of the electronic device relative to the corresponding lead of leads 18, i.e., A-portion shaded in FIG. 5. Accordingly, the stress which is caused because the corresponding lead of leads 18 of the electronic device is tilted in the course of cooling after the soldering process, can be reduced by the sufficient amount of lead-free solder. Therefore, the stress applied to the wall surface and the corner portion at the side opposite to the center of the electronic device can be reduced, and the occurrence of corner cracks and through hole separations can be reduced.

Second Embodiment

Figure 6A:
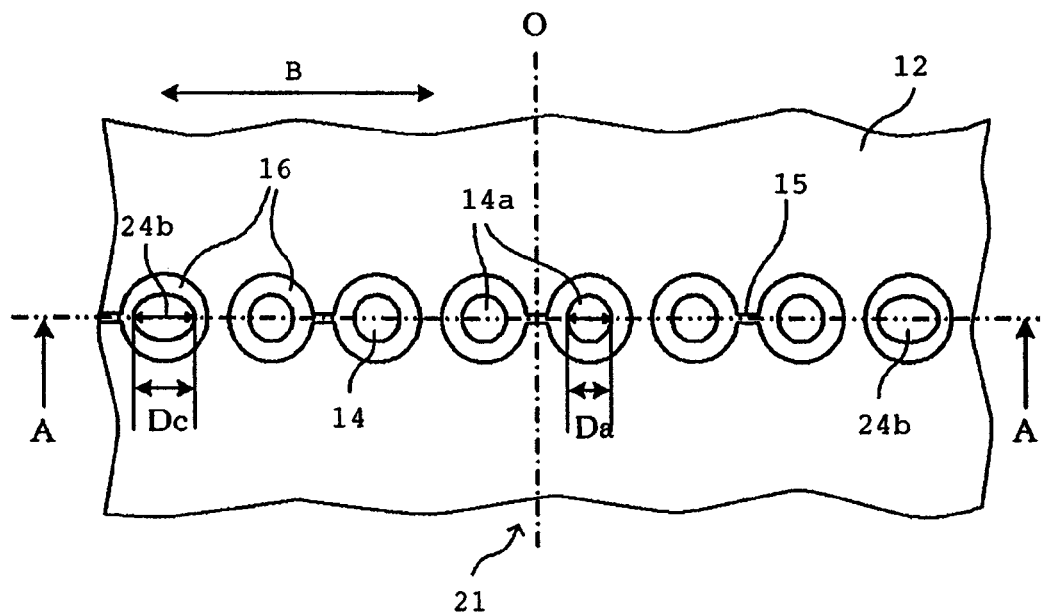
FIG. 6A is a plan view of a multi-layer circuit board according to a second embodiment of the present invention.
Figure 6B:
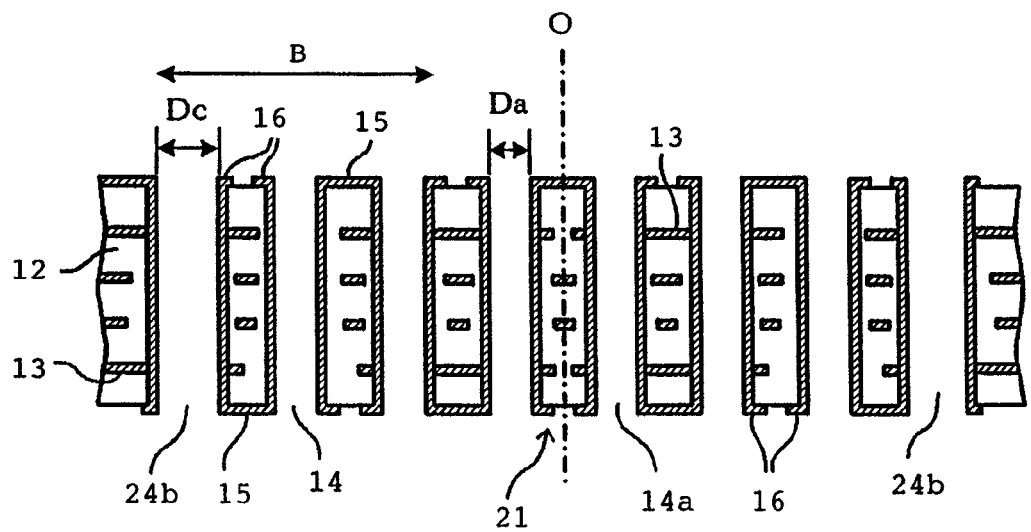
FIG. 6B is a cross-sectional view taken along line A-A in FIG. 6A.

FIG. 6A shows a plan view of multi-layer circuit board 21 according to the second embodiment of the present invention, viewed from the side of the surface on which the device is mounted, and FIG. 6B shows a cross-sectional view taken along line A-A in FIG. 6A. In FIGS. 6A and 6B, the corresponding elements are denoted by the same references as the first embodiment in FIGS. 4A and 4B, and repeated explanations are omitted.

The second embodiment is different from the first embodiment in regard to the point that the shape of outermost end through hole 24b is an ellipse. The major axis direction of this ellipse is the direction parallel to a line that connects the center of center through hole 14a and outermost end through hole 24b at the time when the electronic device is mounted, that is, the longitudinal direction of the case (the direction indicated by arrow B in drawings) in the present embodiment. Major axis Dc of outermost end through hole 24b is larger than diameter Da of center through hole 14a, i.e., Dc>Da is satisfied. In regard to a hole that will become outermost end through hole 24b, such an ellipse-shaped hole may be formed by drilling while moving the drill or the board that will become multi-layer circuit board 21. The length of the minor axis of outermost end through hole 24b may be equal to the diameter of center through hole 14a.

When an electronic device that is similar to the first embodiment and that is shown in FIG. 5, is mounted on multi-layer circuit board 21 according to the present embodiment, the amount of solder filled in outermost end through hole 24 is larger than the amount of solder filled in center through hole 14a. In particular, in outermost end through hole 24b, a sufficient amount of solder can be kept in the area (the area corresponding to A portion in FIG. 5) at the side opposite to the center side of case 17 of the electronic device relative to the corresponding lead of leads 18 of the electronic device, and therefore the same effects as the first embodiment can be obtained.

Third Embodiment

Figure 7:
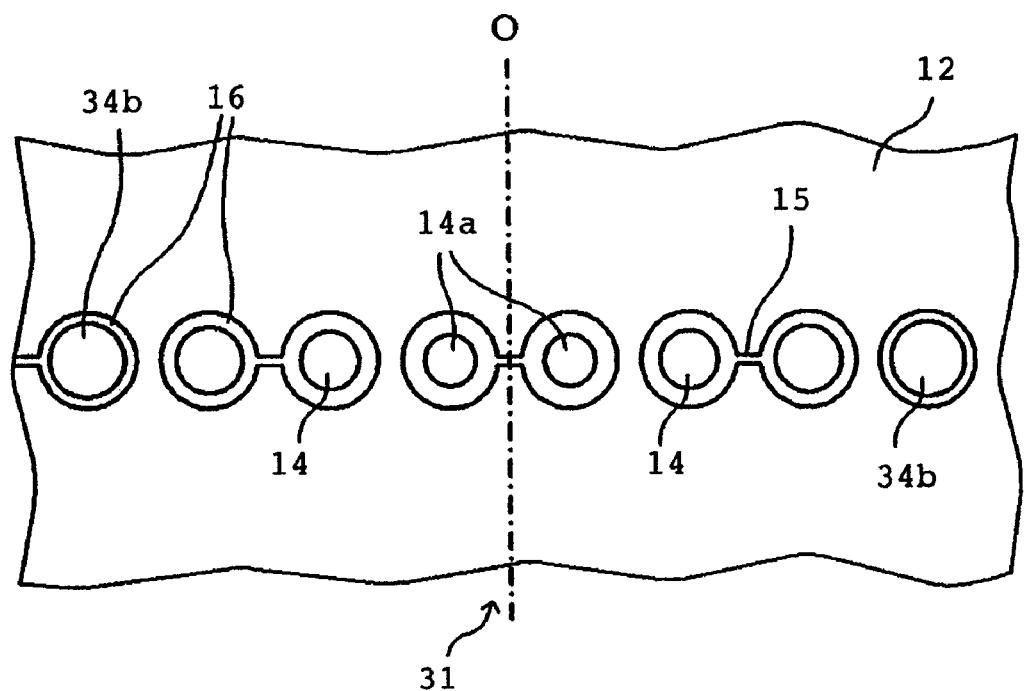
FIG. 7 is a plan view of a multi-layer circuit board according to a third embodiment of the present invention.

FIG. 7 shows a plan view of multi-layer circuit board 31 according to the third embodiment of the present invention, viewed from the side of the surface on which the device is mounted. The present embodiment is different from the first embodiment shown in FIGS. 4A and 4B with regard to the point that not only outer most end through hole 34b but also other through holes 14 vary in size in the present embodiment, as opposed to the first embodiment in which diameters of through holes 14, other than outermost end through hole 14b, are equal. Specifically, in the present embodiment, the diameter of center through hole 14a is the smallest size, and the diameter of the through hole, which is farther from center through hole 14a and closer to outermost end through hole 34b, is larger in stages.

Therefore, according to the present embodiment, in regard to through holes 14 between outermost end through hole 34b and center through hole 14a, the stress applied to the wall surfaces and the corner portions thereof can be reduced, and thus mounting reliability can be further improved.

Fourth Embodiment

Figure 8:
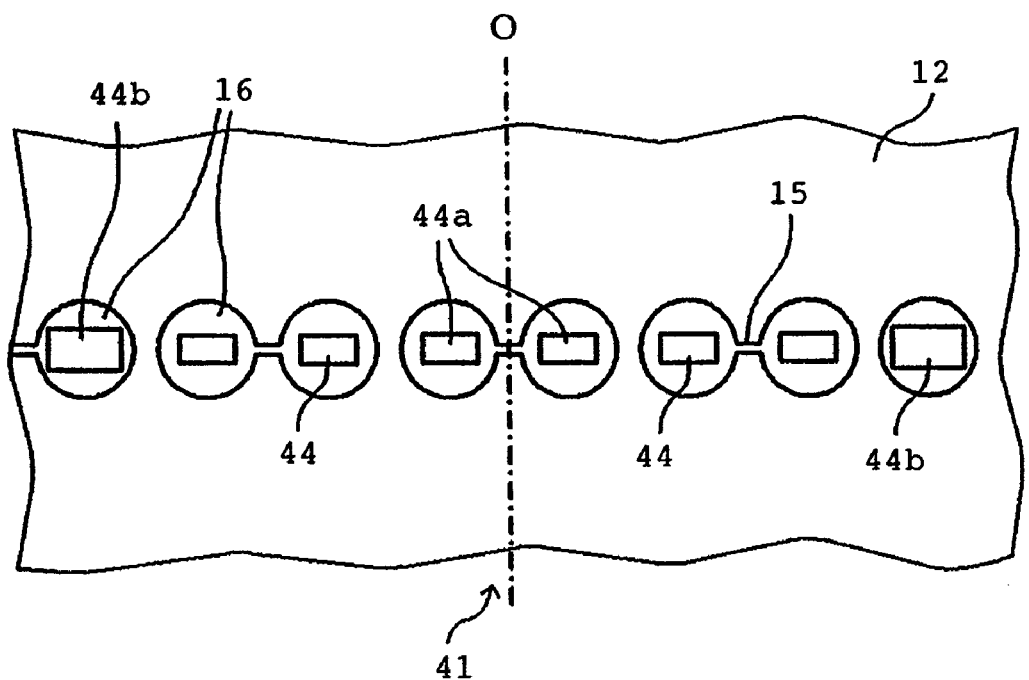
FIG. 8 is a plan view of a multi-layer circuit board according to a fourth embodiment of the present invention.

FIG. 8 shows a plan view of multi-layer circuit board 41 according to the fourth embodiment of the present invention, viewed from the side of the device mounting surface. The present embodiment is different from the first embodiment shown in FIGS. 4A and 4B with regard to the point that the plane shape of through hole 44 is a rectangle in the present embodiment. In the present embodiment, all through holes other than outermost end through hole 44b are similar to center through hole 44a in size and in shape, however, the long side and the short side of outermost end through hole 44b are longer than the long side and the short side of center through hole 44a, respectively.

Fifth Embodiment

Figure 9:
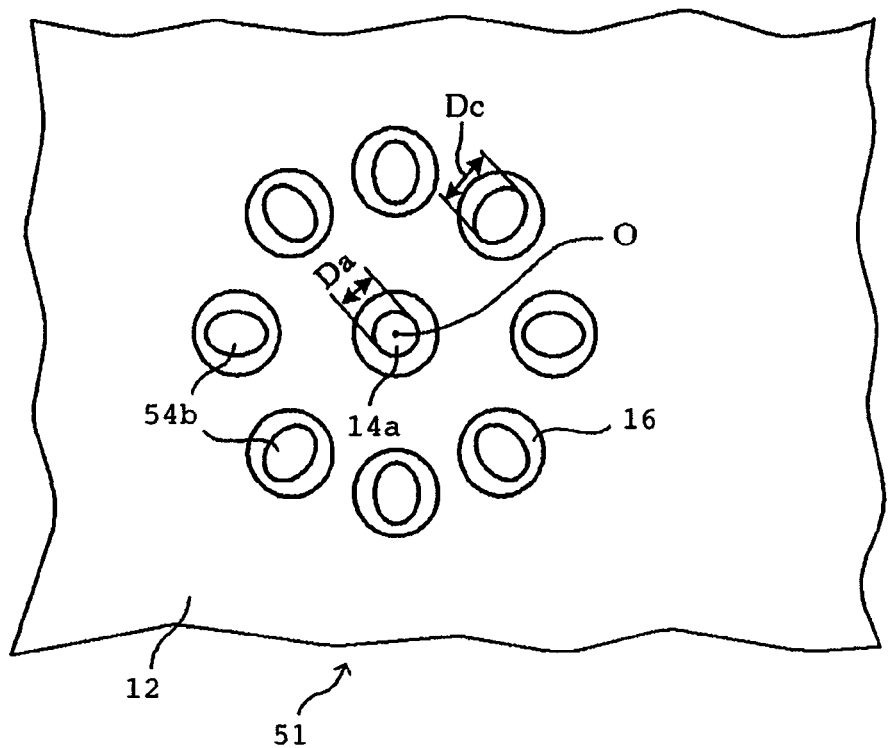
FIG. 9 is a plan view of a multi-layer circuit board according to a fifth embodiment of the present invention.

FIG. 9 shows a plan view of multi-layer circuit board 51 according to the fifth embodiment of the present invention, viewed from the side of the device mounting surface. While the first to fourth embodiments show examples in which the electronic device has leads 18 arranged in a line, leads of an electronic device to be mounted on multi-layer circuit board 51 according to the present embodiment are arranged at the center of the case and at a plurality of positions that are located at equal distances from the center in radius directions. In the present embodiment, center through hole 14a formed at a position nearest to center point O of the case of the electronic device at the time when the electronic device is mounted, and in the present embodiment, formed at the position coincident with the center point, is shaped into a circle of Da in diameter. On the other hand, outermost end through holes 54b, i.e., through holes other than center through hole 14a, which are arranged at the plurality of positions at equal distances from center point O, are formed in ellipse shapes. The major axis direction of the ellipse is the direction of the line that connects the center point of the corresponding through hole and center point O of the case of the electronic device. Also, the length of major axis Dc of outermost end through holes 54b are larger than diameter Da of center through hole 14a.

Sixth Embodiment

Figure 10:
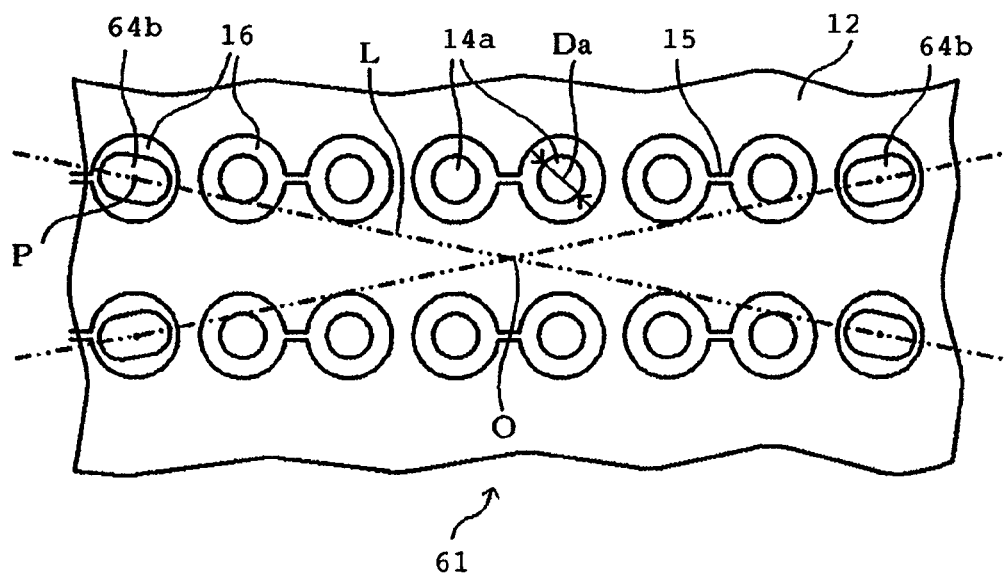
FIG. 10 is a plan view of a multi-layer circuit board according to a sixth embodiment of the present invention.

FIG. 10 shows a plan view of multi-layer circuit board 61 according to the sixth embodiment of the present invention, viewed from the side of the device mounting surface. While the first to fourth embodiments show examples in which the electronic device has leads 18 arranged in a line, the present embodiment shows an example in which an electronic device, that has leads arranged in two lines, is mounted. In the present embodiment, when the electronic device is mounted, center through hole 14a formed at the position nearest to point O at the center point of the case portion is formed into a circle, however, outermost end through hole 64 into which the outermost end lead is inserted is formed into a rectangle whose two opposite sides are formed in hemicycles. A hole in such a shape that will become outermost end through hole 64b, may be formed by drilling while moving the drill or the board that will become multi-layer circuit board 61. The longitudinal direction of outermost end through hole 64b, i.e., the direction in which two parallel sides extend, is parallel with straight line L that connects point O where the center point of the case is positioned when the electronic device is mounted, and point P where the outermost end lead of the electronic device, which is mounted before being soldered, i.e., before being heated, is positioned.

Seventh Embodiment

Figure 11:
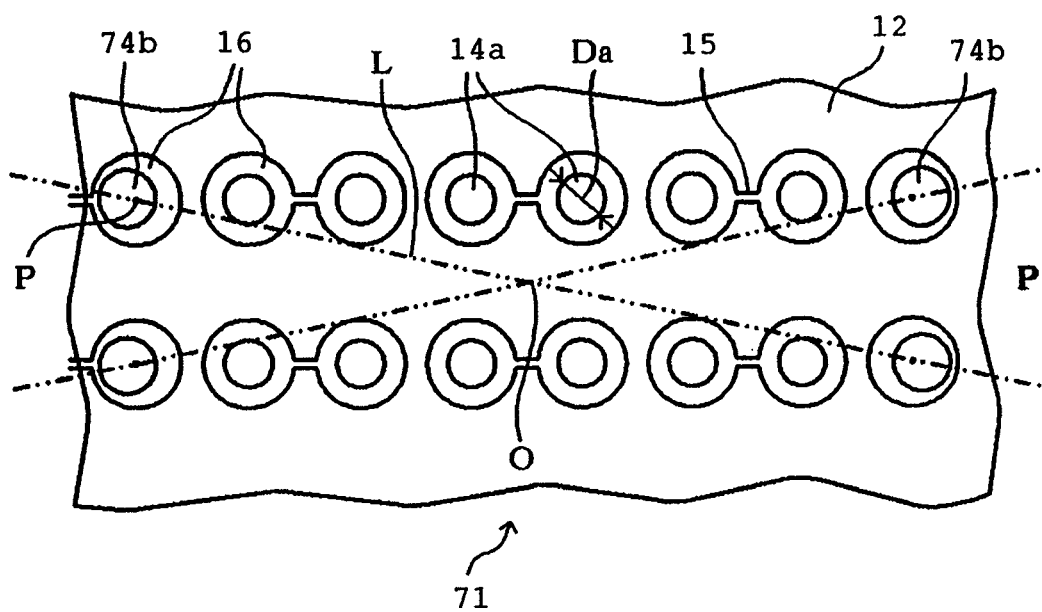
FIG. 11 is a plan view of a multi-layer circuit board according to a seventh embodiment of the present invention.

FIG. 11 shows a plan view of multi-layer circuit board 71 according to the seventh embodiment of the present invention, viewed from the side of the surface on which the device is mounted. The present embodiment is different from the sixth embodiment shown in FIG. 10 with regard to the point that outermost end through hole 74b has a circular plane shape, and the center position thereof is shifted from point P where the outermost end lead of the electronic device, which is mounted before being soldered, i.e., before being heated, is positioned, in the direction away from center O of the case of the electronic device. In the present embodiment, the center position of outermost end through hole 74b is located on the extension of straight line L that connects point P and point O. Further, outermost end through hole 74b is larger than center through hole 14a.

As described above, since the center position of outermost end through hole 74b is sifted to the outside, a sufficient amount of solder can be kept in the portion (the area corresponding to A portion in FIG. 5) at the side away from center O of the case relative to the lead in outermost end through hole 74b when the electronic device is mounted. According to the present embodiment, compared with the case in which the center position of the outermost end through hole is not shifted, even if the diameter of outermost end through hole 74b is made smaller (even if the ratio of the diameter of outermost end through hole 74b to the diameter of center through hole 14a is made smaller), the same effects as in the case in which the center position of the outermost end through hole is not shifted and the diameter is made larger, can be obtained. In other words, according to the present embodiment, a hole that will become outermost end through hole 74b can be made relatively small. Further, in some cases, the diameter of outermost end through hole 74b may be equal to the diameter of center through hole 14a. Therefore, according to the present invention, lowering the mechanical strength and the imposition of restrictions on the land area due to an increase of the plane shape of the outermost end through hole, can be prevented.

Shifting the center position of the outermost end through hole away from the center of the case of the electronic device can be done when the thermal expansion coefficient of the case of the electronic device is larger than the thermal expansion coefficient of the circuit board. On the other hand, when the thermal expansion coefficient of the case of the electronic device is smaller than the thermal expansion coefficient of the circuit board, the center position of the outermost end through hole is suitably shifted to be close to the center direction of the case of the electronic device.

Up to this point, the preferred embodiments have been explained, however, the present invention is not limited to these embodiments, and a modification within the scope of the present invention may be appropriately made. For example, in each embodiment, the multi-layer circuit board is explained as an example, however, the present invention is also available to a double-sided circuit board. Also, the shape of the through hole may be a shape other than those explained in each embodiment, and, for example, a gourd shape formed by drilling twice may be available.

The invention claimed is:

1. A circuit board having mounted thereon an electronic device having a plurality of leads and a case, wherein said circuit board has a plurality of through holes into which said plurality of leads of an electronic device are inserted and soldered with lead-free solder:

wherein a conductive film is formed on a wall surface of said through holes, and a volume of a through hole of said through holes, into which an outermost end lead of said leads of said electronic device is inserted, is larger than a volume of a through hole of said through holes, into which a lead of said leads, which is located at a position nearest to a center of said electronic device, is inserted, and wherein the distal ends of said leads are tilted towards a center of the case of the electronic device.

2. The circuit board according to claim 1, wherein a plane shape of each of said through holes is a circle, and wherein a diameter of said through hole, into which said outermost end lead of said electronic device is inserted, is larger than a diameter of said through hole, into which said lead at the position nearest to the center of said electronic device is inserted.

3. The circuit board according to claim 2, wherein the diameter of said through hole, into which said outermost end lead of said electronic device is inserted, is not more than twice the diameter of said through hole, into which said lead at the position nearest to the center of said electronic device is inserted.

4. The circuit board according to claim 1, wherein shapes of through holes of said through holes, which are located between said through hole, into which said lead at the position nearest to the center of said electronic device is inserted, and said through hole, into which said outermost end lead of said electronic device is inserted, are gradually changed from a shape of said through hole into which said lead at the position nearest to the center of said electronic device is inserted to a shape of said through hole into which said outermost end lead of said electronic device is inserted.

5. The circuit board according to claim 1, wherein a center position of said through hole into which said outermost end lead of said electronic device is inserted is shifted in a direction away from a center position of said electronic device at the time of being mounted, from a position of said outermost end lead of said electronic device, which is mounted before being soldered, when a thermal expansion coefficient of said electronic device is larger than a thermal expansion coefficient of said circuit board, and the center position is shifted in a direction approaching a center of said electronic device at the time of being mounted, from a position of said outermost end lead of said electronic device, which is mounted before being soldered, when the thermal expansion coefficient of said electronic device is smaller than the thermal expansion coefficient of said circuit board.

6. A circuit board having mounted thereon an electronic device having a plurality of leads and a case, wherein said circuit board has a plurality of through holes into which said plurality of leads of an electronic device are inserted and soldered with lead-free solder:
  wherein a conductive film is formed on a wall surface of said through holes, and
  a plane shape of a through hole of said through holes, into which a lead of said leads which is located at a position nearest to a center of said electronic device is inserted, is a circle, wherein a plane shape of a through hole of said through holes, into which an outermost end lead of said leads of said electronic device is inserted, is an ellipse having a major axis in a direction parallel with a line that connects a center of the corresponding through hole and a center position of said electronic device at a time of being mounted, and wherein a length of the major axis of said ellipse is longer than a diameter of said through hole, into which said lead at the position nearest to the center of said electronic device is inserted, wherein the diameter of said through hole, into which said lead at the position nearest to the center of said electronic device is inserted, is at least as long as a minor axis of said ellipse, and wherein the distal ends of said leads are tilted towards a center of the case of the electronic device.

7. A circuit board having mounted thereon an electronic device having a plurality of leads and a case, wherein said circuit board has a plurality of through holes into which said plurality of leads of an electronic device are inserted and soldered with lead-free solder:
  wherein a conductive film is formed on a wall surface of said through holes, and
  a size of a through hole of said through holes, into which an outermost end lead of said leads of said electronic device is inserted, the size being measured in a direction of a line that connects a position of said outermost end lead of said electronic device being mounted before being soldered and a center position of said electronic device at a time of being mounted, is larger than a size of a through hole of said through holes, into which a lead of said leads which is located at the position nearest to the center of said electronic device is inserted, the size being measured in any direction in a plane, and wherein the distal ends of said leads are tilted towards a center of the case of the electronic device.

8. The circuit board according to claim 7, wherein an opening of said through hole into which said outermost end lead of said electronic device is inserted is formed by drilling more than once or by moving a drill relative to the board.

9. A circuit board having mounted thereon an electronic device having a plurality of leads and a case, wherein said circuit board has a plurality of through holes into which said plurality of leads of an electronic device are inserted and soldered with lead-free solder:
  wherein a conductive film is formed on a wall surface of said through holes, and
  a center position of a through hole of said through holes, into which an outermost end lead of said leads of said electronic device is inserted, is shifted in a direction away from a center position of said electronic device at the time of being mounted, from a position of said outermost end lead of said electronic device, which is mounted before being soldered, when a thermal expansion coefficient of said electronic device is larger than a thermal expansion coefficient of said circuit board, and the center position is shifted in a direction approaching a center of said electronic device at a time of being mounted, from the position of said outermost end lead of said electronic device, which is mounted before being soldered, when the thermal expansion coefficient of said electronic device is smaller than the thermal expansion coefficient of said circuit board, and wherein the distal ends of said leads are tilted towards a center of the case of the electronic device.

* * * * *